United States Patent [19]

Barkley et al.

[11] 4,303,992
[45] Dec. 1, 1981

[54] SERIAL PARALLEL CHARGE COUPLED DEVICE EMPLOYING A GATE SPLITTING DEVICE

[75] Inventors: Keith G. Barkley, Hopewell Junction; Majid Ghafghaichi, Poughkeepsie; Yelandur R. Gopalakrishna, Wappingers Falls; Albert J. Tzou, Poughkeepsie, all of N.Y.

[73] Assignee: International Business Machines Corporation, Armonk, N.Y.

[21] Appl. No.: 149,377

[22] Filed: May 13, 1980

[51] Int. Cl.³ .................. G11C 13/00; G11C 11/42
[52] U.S. Cl. .................................. 365/51; 365/183
[58] Field of Search .................... 365/51, 174, 183

[56] References Cited

U.S. PATENT DOCUMENTS 4,092,734  5/1978  Collins et al. .................. 365/238

Primary Examiner—Terrell W. Fears
Attorney, Agent, or Firm—James E. Murray

[57] ABSTRACT

This serial to parallel to serial (SPS) charge coupled device (CCD) shift register memory has a serial output shift register with gate electrode structures that are interdigitated with the gate electrode structures of each last stage of a plurality of parallel shift registers to transfer interlaced data bits from the parallel shift registers to the serial output register in a sequential order.

6 Claims, 7 Drawing Figures

SERIAL PARALLEL CHARGE COUPLED DEVICE EMPLOYING A GATE SPLITTING DEVICE

BACKGROUND OF THE INVENTION

The present invention relates to a serial to parallel to serial (SPS) charge coupled device (CCD) shift register memory and more particularly to the transfer of data from the parallel shift registers to the serial output shift register of such a memory.

In a certain type of serial to parallel to serial charge coupled device shift register memory, two groupings of sequentially ordered bits are interlaced when they are fed into the parallel shift registers of the memory and as a result are not arranged sequentially when they reach the outputs of those parallel shift registers for shifting out of the memory through the serial output register of the memory. In the Kosonocky et al U.S. Pat. No. 3,967,254, sorting stages are inserted between the end of the parallel shift registers and the serial output shift registers to place the interlaced data back into its original groupings of sequentially ordered bits and then to transfer these groupings one at a time to the output shift register so that the bits then emerge from the output shift register a grouping at a time in ascending sequential order.

The sorting stages in the mentioned Kosonocky et al patent have two interdigitated electrodes. Each electrode has fingers that shield the last stage of a different set of the parallel shift registers from potentials applied by one of two transfer electrodes overlying the interdigitated electrodes. By first applying a transfer pulse to one of the transfer electrodes and then at a different time to the other of the transfer electrodes, data bits making up one of the original groupings can be transferred to the output shift register at a different time than data bits from the other of the original groupings. Still another transfer pulse is applied to a third transfer electrode to synchronize the transfer of the separated groupings to the output shift register for the SPS device.

THE INVENTION

In accordance with the present invention, one transfer pulse, one of the interdigitated shielding electrodes and the transfer electrode described above are eliminated. This is accomplished by having an output shift register with electrode structures that are interdigitated with the remaining shielding electrode to perform the functions of the shielding electrode and by adjusting the timing of the transfer pulses for the output electrodes to accept the two data bit groupings on different stages of the output electrodes.

Therefore, it is the object of the present invention to provide a simple serial-parallel-serial storage matrix.

It is another object to decrease the size of a serial-parallel-serial storage matrix.

THE DRAWINGS

This and other objects of the invention can be better understood to the accompanying drawings of which;

DETAILED EMBODIMENT

Figure 1:
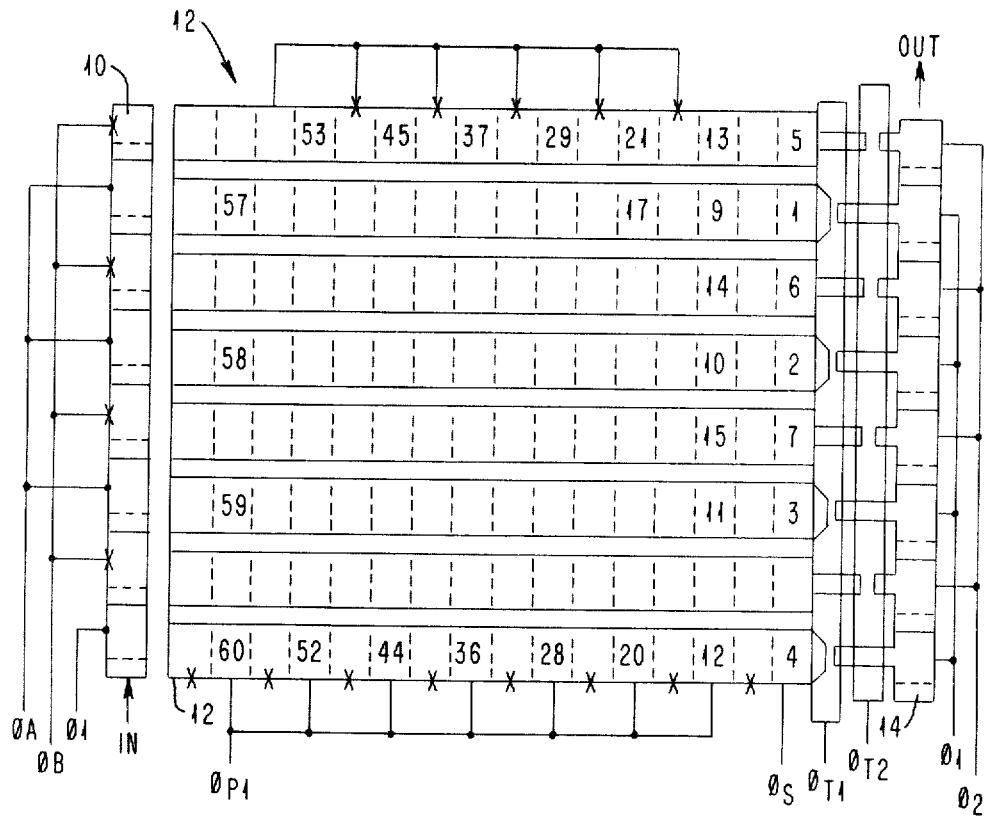
FIG. 1 is a schematic representation of a 8×8 serial to parallel to serial shift register memory.

Referring now to FIG. 1, a serial to parallel to serial memory contains an input register 10, which receives a byte or 8 bits of serial data and transfers each bit to a different one of 8 parallel registers 12. The eight data bits are stepped along together in the parallel registers to a serial output register where the bits are placed back into serial form passed out of the memory.

Figure 2:
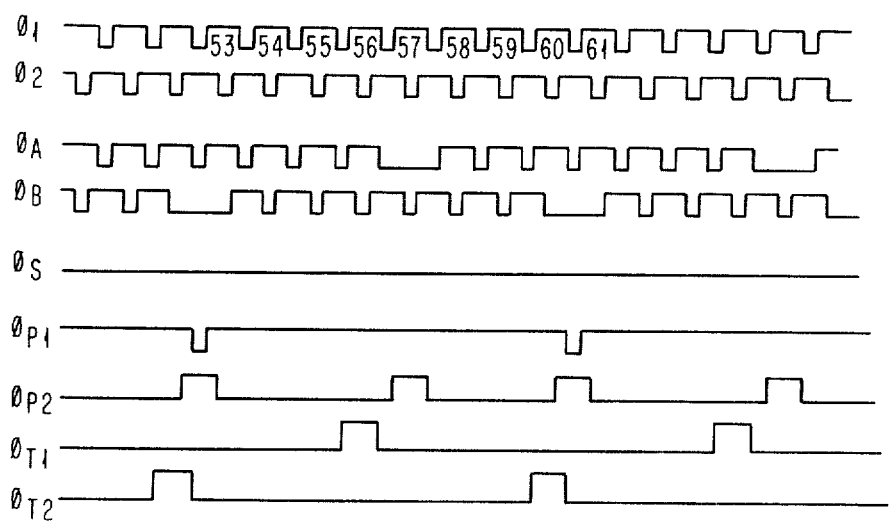
FIG. 2 is a diagram for the pulses used in the memory of FIG. 1.

The $\phi_1$, $\phi_A$ and $\phi_B$ voltages shown in FIG. 2 energize alternate stages of the input register 10 at different times to step the eight serial bits data into the register 10 in two groups of 4 bits each. First, bits 1 through 4 are loaded into the input shift register 10. When these bits have been stepped into the 2nd, 4th, 6th and 8th stages respectively, the $\phi_{P2}$ pulse comes up to transfer them to the first stages of the 2nd, 4th, 6th and 8th order parallel registers 12 where order is determined by position from top to bottom. Thereafter, bits 5 to 8 are placed into the input register 10 in stages of 1, 3, 5 and 7 respectively whereupon the $\phi_{P2}$ pulse comes up again to place bits 5 to 8 in the first stage of the 1, 3, 5 and 7th order parallel registers 12 interlaced between the bits 1 to 4. The $\phi_{P1}$ and $\phi_{P2}$ voltages then operate to transfer this byte of interlaced data from stage to stage of the parallel registers 12 until they reach output stages of the registers 12.

As the first type is removed from stage to stage of the parallel registers, other bytes of data are loaded into the parallel registers in the same manner described in connection with the first byte until alternate stages of the registers 12 are filled with bytes of interlaced data. When the parallel registers are filled, the first byte of bits 1 to 8 is in position to be transferred into the serial output register 14. However, before the transfer out of the data from the parallel registers 12 into the serial output register, the interlaced bits of the byte must be rearranged in order to place them back in ascending numerical sequence. In accordance with the present invention, a new structure is provided for performing this rearranging of the bits.

Figure 3:
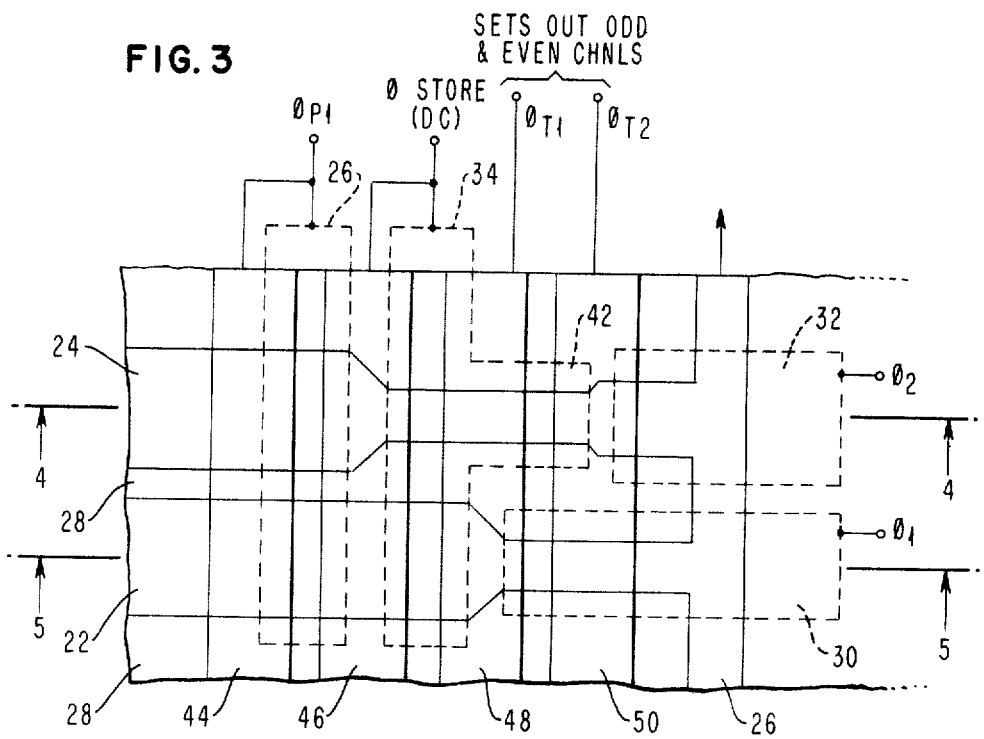
FIG. 3 is a plain view of the interface between the output stages of two of the parallel shift registers and the serial output shift registers of the memory shown in FIG. 1.
Figure 4:
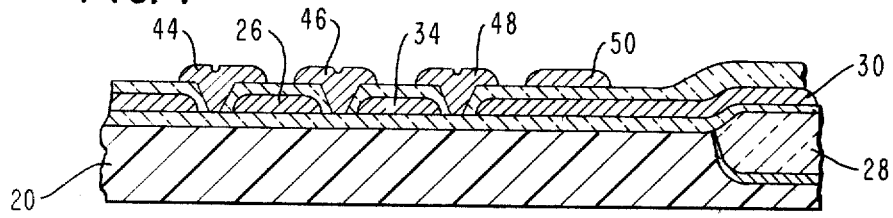
FIG. 4 is a section taken along line 4—4 in FIG. 3.
Figure 5:
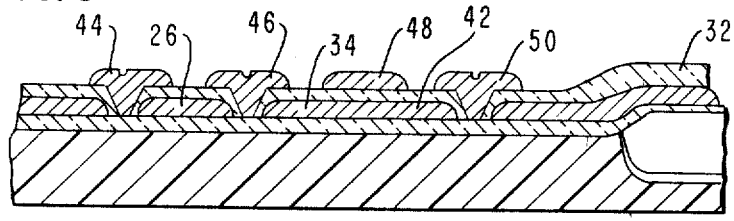
FIG. 5 is a section taken along line 5—5 in FIG. 3.

To better understand this new structure, reference is made to FIGS. 3, 4 and 5. As shown, a P type silicon substrate 20 has a plurality of parallel paths 22 and 24, defining the channels of the parallel shift registers 12. These paths are joined at their ends by a path 26 defining the channel of the output shift register 14. The paths 22, 24 and 26 are defined by channel stops 28 formed in accordance with known techniques.

A number of electrodes overlay the paths 22, 24 and 26 to control the movement of data in the form of charge along the paths. A gate electrodes 30 to 38 made of polysilicon I overlie all eight channels on an oxide layer 40 as shown. The horizontal electrodes 30 and 32 each define a stage of the output shift register with every other electrode 30 being longer than the electrode 32 between them. The vertical electrode 34 has horizontal segments 42 that oppose the shorter horizontal gates 32 of the output shift register 14. Vertical polysilicon gate electrodes 44 to 54 formed of polysilicon II partially overlie the polysilicon I gate electrodes 30 to 38 on an oxide layer 40 as illustrated. The control voltages of $\phi_{P1}$, $\phi_{store}$, $\phi T1$ and $\phi_{T2}$ are connected to the gate electrodes as illustrated to transfer data bits in the form of charge packets along the channels 22 to 26. Only one stage of the parallel shift registers 12 is shown. Other stages of these parallel shift registers 12 have gate electrode configurations similar to the arrangement of electrodes shown connected with alternate stages connected to the $\phi_{P1}$ and $\phi_{P2}$ sources.

Figure 6:
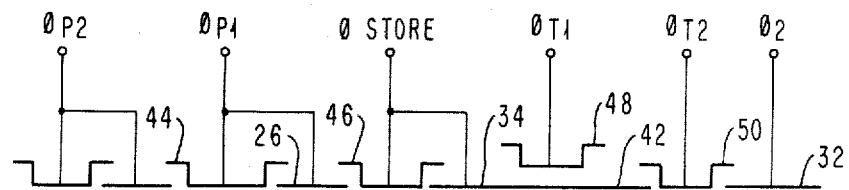
FIG. 6 is a schematic representing the potentials along line 5—5.
Figure 6:
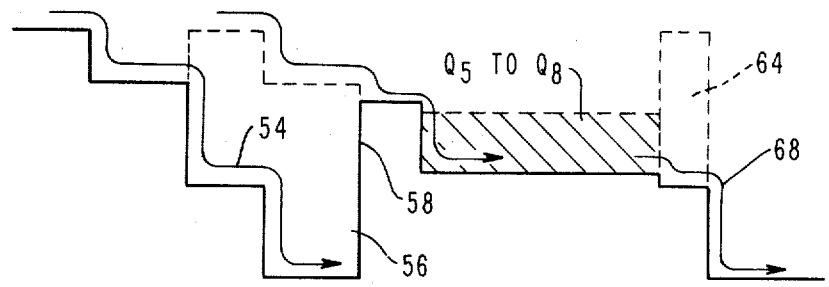
Figure 7:
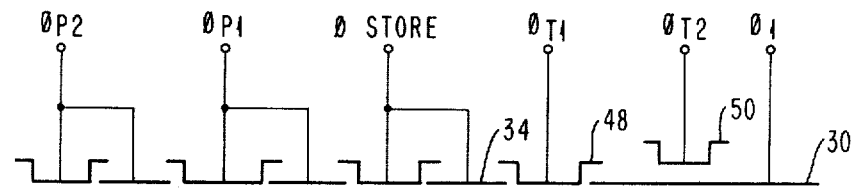
FIG. 7 is a potential and charge under devices along line 4—4 in FIG. 3.
Figure 7:
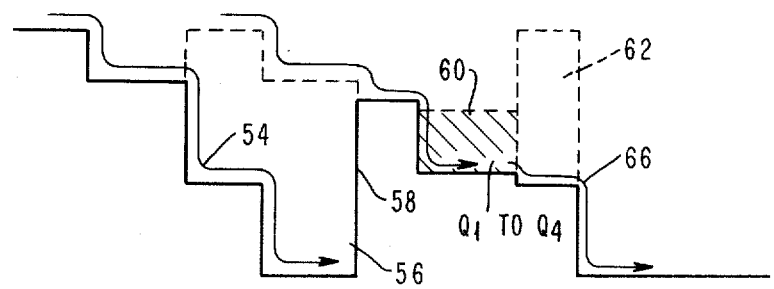

By referring to FIGS. 2, 6 and 7, it can be seen how the voltage on the gate electrodes is controlled to move the charge packets from the output stages of the parallel shift register into the stages of the output shift register 14. FIGS. 7 and 6 represent the well patterns and charge transfer for bits 1 to 4 and 5 to 8 respectively. In both figures, when $\phi_{P2}$ goes down while $\phi_{P1}$ is up the charge takes path 70 to the bottom of the well 56 of the last stages of all eight shift parallel shift registers being block to further advance by the barrier established by the fixed DC potentials on the $\phi_{store}$ electrodes 46. When the voltage $\phi_{P1}$ next goes down, charge is raised above the barrier 58 and dropped into a well 60 under electrode 34. The charge packets $Q_1$ and $Q_4$ for bits 1 to 4 are held from further advance by the barrier 62 established by the potential $\phi_{T1}$ on electrode 48 while the charge packets $Q_5$ to $Q_8$ for bits 5 to 8 is held from further advance by the barrier 64 established by the potential on electrode 50. The potential $\phi_{T1}$ is raised first allowing the charge packets $Q_1$ to $Q_4$ to move along path 66 into stages in the output register under electrodes 30 where they are shifted out in sequence by the alternation of potentials $Q_1$ and $Q_2$. After the charge packets $Q_1$ and $Q_4$ have been moved out of the output shift register 14, voltage $\phi_{T2}$ comes up dropping the barrier 64 and allowing the charge packets $Q_4$ to $Q_8$ to drop along path 68 into the stages of the output registers under electrodes 32 where they are also shifted out of the output shift registers by the alternating pulses of the voltages $\phi_1$ and $\phi_2$.

One embodiment of this invention has been described. Obviously, a number of changes can be made in this invention without departing from the spirit and scope of the invention. For instance, the DC volage $\phi_{store}$ can be eliminated by pulsing electrodes as shown in the copending Application Ser. No. 162,851 and entitled "Low Voltage Serial to Parallel to Serial Charge Coupled Device". Therefore, it should be understood that changes in form and details can be made in the described embodiment without departing from the spirit and scope of the invention.

Having thus described our invention, what we claim as new, and desire to secure by Letters Patents is:

1. In a serial to parallel to serial charge coupled device shift register memory of the type having channels for a plurality of parallel shift registers all terminating in a channel for a single serial shift register, the improvement comprising,
   a plurality of gate electrodes means of two different lengths overlying the channel of said serial register with the longer electrodes also overlying the ends every other of the channels for said parallel shift registers and the shorter gate electrodes positioned between each two longer electrodes at the end of the intervening channels for a parallel registers,
   a single gate electrode means overlying all of the channels of said parallel shift adjacent to said plurality of said gate electrodes and having extensions juxtaposed between said longer electrodes and facing said shorter electrodes, and
   transfer electrode means overlying said longer of the plurality of gate electrodes and said extensions for transfer of data from said parallel registers to said serial registers in two groups.

2. The shift register memory of claim 1 including electric pulse means coupled to said plurality of gate electrodes and said for supplying sequences of pulses to transfer data from said parallel registers to said serial output register in sequential order.

3. The shift register memory of claim 2 wherein said transfer electrode means includes two electrodes which are always activated for transfer of data at different times.

4. In a serial to parallel to serial charge coupled device shift register memory of the type having the channels for a plurality of parallel shift registers all terminating in a channel for a single serial shift register and also having a set of shielding electrodes with interdigitated elements lying under two transfer electrodes to shield a different half of said plurality of parallel shift registers with each half of the set of shielding electrodes, the improvement comprising one of the halves of the set of shielding electrodes is formed of interlaced short and long electrodes that are positioned over the channel of the single serial shift register and functions as shifting electrodes for the single serial shift register.

5. The shift register memory of claim 4 including electric pulse means coupled to said plurality of gate electrodes and said for supplying sequences of pulses to transfer data from said parallel registers to said serial output register in sequential order.

6. The shift register memory of claim 5 wherein said transfer electrode means includes two electrodes which are always activated for transfer of data at different times.

* * * * *